(12) United States Patent
Cheng et al.

(10) Patent No.: US 8,163,404 B2
(45) Date of Patent: Apr. 24, 2012

(54) CHLORINE, FLUORINE AND LITHIUM CO-DOPED TRANSPARENT CONDUCTIVE FILMS AND METHODS FOR FABRICATING THE SAME

(75) Inventors: Syh-Yuh Cheng, Hsinchu (TW);
Chia-Hsin Lin, Hsinchu (TW);
Chin-Ching Lin, Taichung (TW);
Mei-Ching Chiang, Shulin (TW)

(73) Assignee: Industrial Technology Research Institute (TW)

( * ) Notice: Subject to any disclaimer, the term of this patent is extended or adjusted under 35 U.S.C. 154(b) by 739 days.

(21) Appl. No.: 12/260,466

(22) Filed: Oct. 29, 2008

(65) Prior Publication Data

US 2009/0162697 A1 Jun. 25, 2009

(30) Foreign Application Priority Data

Dec. 25, 2007 (TW) .............................. 96149874 A

(51) Int. Cl.
*C23C 16/40* (2006.01)
*C23C 16/448* (2006.01)
*B32B 9/04* (2006.01)

(52) U.S. Cl. ......... 428/702; 428/646; 428/643; 428/701

(58) Field of Classification Search .................... None
See application file for complete search history.

(56) References Cited

U.S. PATENT DOCUMENTS

| | | | | |
|---|---|---|---|---|
| 4,433,202 A * | 2/1984 | Maruyama et al. | ........... | 136/255 |
| 5,393,593 A * | 2/1995 | Gulotta et al. | ................. | 428/220 |
| 6,287,993 B1 * | 9/2001 | Fu et al. | .............. | 501/5 |
| 6,727,522 B1 * | 4/2004 | Kawasaki et al. | ............. | 257/103 |
| 6,818,702 B1 | 11/2004 | Orikabe et al. | | |
| 7,270,880 B2 * | 9/2007 | Pichot et al. | .................. | 428/403 |
| 2006/0261350 A1 * | 11/2006 | Kawazoe et al. | ............... | 257/79 |
| 2007/0088134 A1 | 4/2007 | Suzuki et al. | | |
| 2007/0293636 A1 | 12/2007 | Kimura et al. | | |
| 2010/0288348 A1 * | 11/2010 | Lin et al. | ...................... | 136/256 |
| 2011/0088778 A1 * | 4/2011 | Lin et al. | ....................... | 136/257 |

FOREIGN PATENT DOCUMENTS

| | | | |
|---|---|---|---|
| JP | 2005-268724 | * | 9/2005 |
| JP | 2006124681 | | 5/2006 |
| JP | 2007246648 | | 9/2007 |

OTHER PUBLICATIONS

Abass, A.K. Solid State Communication (abstract) vol. 61, 8, 1987.*

* cited by examiner

*Primary Examiner* — Jennifer McNeil
*Assistant Examiner* — Vera Katz
(74) *Attorney, Agent, or Firm* — Lowe Hauptman Ham & Berner, LLP

(57) ABSTRACT

A chlorine, fluorine and lithium co-doped transparent conductive film is provided, including chlorine, fluorine and lithium co-doped tin oxides, wherein the chlorine, fluorine and lithium co-doped tin oxides have a chlorine ion doping concentration not greater than 5 atom %, a fluorine ion doping concentration not greater than 5 atom %, and a lithium ion doping concentration not greater than 5 atom %.

3 Claims, 4 Drawing Sheets

CHLORINE, FLUORINE AND LITHIUM CO-DOPED TRANSPARENT CONDUCTIVE FILMS AND METHODS FOR FABRICATING THE SAME

CROSS REFERENCE TO RELATED APPLICATIONS

This Application claims priority of Taiwan Patent Application No. 096149874, filed on Dec. 25, 2007, the entirety of which is incorporated by reference herein.

BACKGROUND OF THE INVENTION

1. Field of the Invention

The invention relates to fabrication of transparent conductive films, and in particular to chlorine, fluorine and lithium co-doped transparent conductive films and methods for fabricating the same.

2. Description of the Related Art

Demand and application for transparent conductive films have increased. For example, electronic devices using flat display panels, such as liquid crystal displays, electroluminescence panels, plasma display panels, and field emission displays, touch panels, and solar cells all apply transparent conductive films as electrode materials therein. Additionally, increased development and use of computers, communication devices, consumer electronic devices and energy efficient devices have all increased demand for transparent conductive films.

Indium tin oxide (ITO) is one of the most popularly required materials for fabricating transparent conductive films and is typically formed by a vacuum sputtering process. Nevertheless, since the machinery for the vacuum sputtering process required for fabricating the ITO is expensive and due to the fabricating method, use of the indium ions required in the ITO are cost-ineffective, transparent conductive films fabricated using the ITO material and conventional fabricating methods are costly. Thus, one area of development to decrease costs of transparent conducting films is to reduce indium ions required in the ITO and develop a more cost-effective fabricating method.

BRIEF SUMMARY OF THE INVENTION

Accordingly, a chlorine, fluorine and lithium co-doped transparent conductive film and a method for fabricating the same are provided.

An exemplary chlorine, fluorine and lithium co-doped transparent conductive film comprises chlorine, fluorine and lithium co-doped tin oxides, wherein the chlorine, fluorine and lithium co-doped tin oxides have a chlorine ion doping concentration not greater than 5 atom %, a fluorine ion doping concentration not greater than 5 atom %, and a lithium ion doping concentration not greater than 5 atom %.

An exemplary method for fabricating a chlorine, fluorine and lithium co-doped transparent conductive film comprises providing a substrate in a reaction chamber and providing a reaction gas and an oxygen-containing gas into the reaction chamber at a reaction temperature of about 200-850° C. and at a normal pressure and transferring the reaction gas to the substrate by the oxygen-containing gas, thereby forming the chlorine, fluorine and lithium co-doped transparent conductive film on the substrate, wherein the reaction gas comprises a vaporized gas obtained by vaporizing a mixture comprising a tin chloride, a fluorine-containing compound, and a lithium-containing compound at the reaction temperature.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

Figure 1:
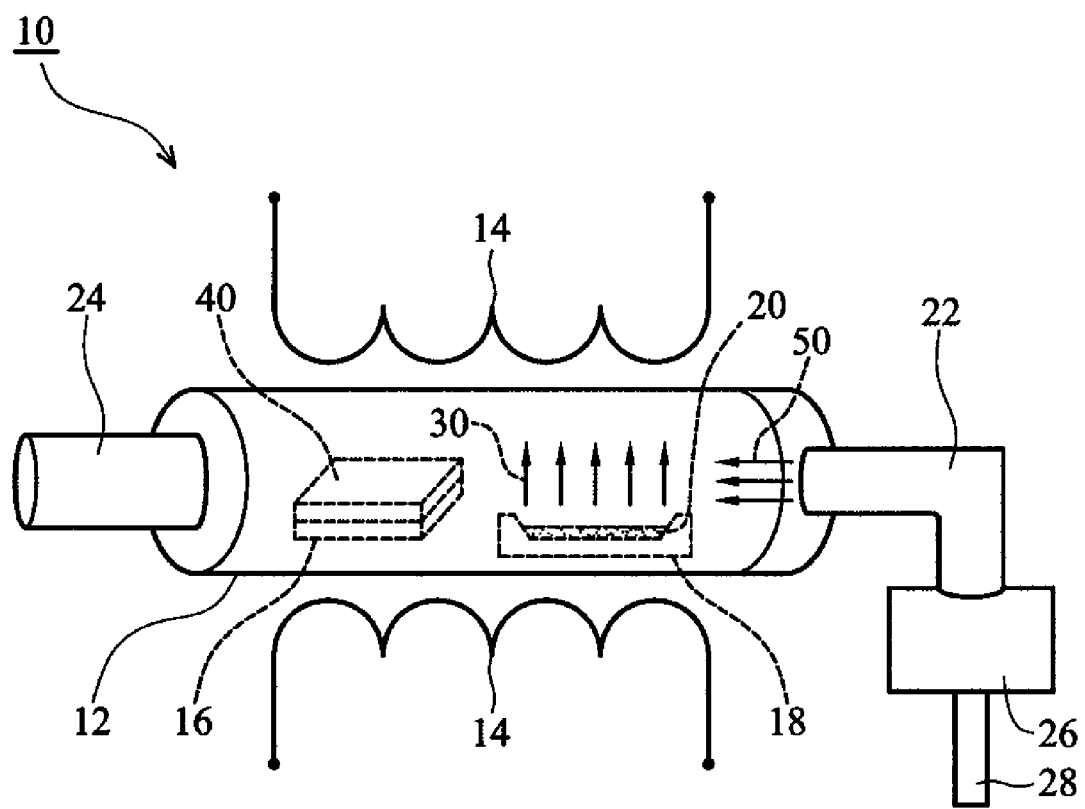
FIG. 1 is a schematic diagram showing a film deposition system according an embodiment of the invention.

The following description is of the best-contemplated mode of carrying out the invention. This description is made for the purpose of illustrating the general principles of the invention and should not be taken in a limiting sense. The scope of the invention is best determined by reference to the appended claims.

The invention provides a chlorine, fluorine and lithium co-doped transparent conductive film comprising chlorine, fluorine and lithium co-doped tin oxides. The chlorine, fluorine and lithium co-doped tin oxides have a chlorine ion doping concentration not greater than 5 atom %, a fluorine ion doping concentration not greater than 5 atom %, and a lithium ion doping concentration not greater than 5 atom %,. Preferably, the chlorine, fluorine and lithium co-doped tin oxides comprise no indium ions.

In one embodiment, the chlorine, fluorine and lithium co-doped tin oxides in the chlorine, fluorine and lithium co-doped transparent conductive film have a visible light transmittance greater than 80% while a thickness thereof is about 100-150 nm. In another embodiment, the chlorine, fluorine and lithium co-doped tin oxides in the chlorine, fluorine and lithium co-doped transparent conductive film have a visible light transmittance greater than 70% while a thickness thereof is about 150-250 nm.

In yet another embodiment, the chlorine, fluorine and lithium co-doped tin oxides in the chlorine, fluorine and lithium co-doped transparent conductive film have a resistance of less than $5 \times 10^{-4}$ Ω·cm and resistance may only slightly change after treatments of atmospheric microwave plasma or reductive plasma.

In addition, the invention also provides a method for fabricating a chlorine, fluorine and lithium co-doped transparent conductive film, comprising providing a substrate in a reaction chamber, and providing a reaction gas and an oxygen-containing gas into the reaction chamber at a reaction temperature of about 200-850° C. and a normal pressure and transferring the reaction gas to the substrate by the oxygen-containing gas, thereby forming the chlorine, fluorine and lithium co-doped transparent conductive film on the substrate, wherein the reaction gas is a vaporized gas obtained by vaporizing a mixture comprising a tin chloride, a fluorine-containing compound, and a lithium-containing compound at the reaction temperature. The oxygen-containing gas can be air, oxygen or moisture.

In an embodiment, the fluorine-containing compound may comprise, for example, ammonium fluoride, tin fluoride, zinc fluoride or aluminum fluoride, and the lithium-containing compound may comprise, for example, lithium nitrate, lithium acetate, lithium chloride, lithium carbonate, lithium oxalate, or lithium phosphate. The tin chloride, the fluorine-containing compound, and the lithium-containing compound in the mixture have a weight ratio of about 100:5:5~100:50: 50. In another embodiment, the fluorine-containing compound and the lithium-containing compound comprise lithium fluoride, and the tin chloride and the lithium fluoride in the mixture have a weight ratio of about 100:5~100:50.

In yet another embodiment, the tin chloride is tin (II) chloride or tin (IV) chloride comprising two or more hydrates and may have a melting point of about 200-850° C. In one embodiment, the chlorine, fluorine and lithium co-doped transparent conductive film may comprise a chlorine doping concentration of about 0.1-5 atom %. In another embodiment, the chlorine, fluorine and lithium co-doped transparent conductive film may comprise a fluorine doping concentration of about 0.1-5 atom %. In yet another embodiment, the mixture is vaporized by a thermal heating method or a plasma heating method. In another embodiment, the chlorine, fluorine and lithium co-doped transparent conductive film may have a thickness of about 100-500 nm.

Although, the chlorine, fluorine and lithium co-doped transparent conductive film of the invention omits use of indium ions, the chlorine, fluorine and lithium co-doped transparent conductive film of the invention still has a predetermined visible light transmittance and conductivity. Additionally, conductivity of the chlorine, fluorine and lithium co-doped transparent conductive film after a plasma treatment performed thereto may only slightly change, thereby allowing application as electrode materials in electronic devices such as flat display panels, touch panels, and solar cells. Moreover, the chlorine, fluorine and lithium co-doped transparent conductive film of the invention can be fabricated at a normal pressure and can be more easily fabricated compared to the high vacuum fabricating process for transparent conductive films of ITO materials. Thereby, simplifying the processes and reducing costs of fabricating transparent conductive films.

Embodiment 1

FIG. 1 illustrates a schematic diagram showing a film deposition system 10 according to an embodiment of the invention. The chlorine, fluorine and lithium co-doped transparent conductive film of the invention is formed by the film deposition system 10.

As shown in FIG. 1, the film deposition system 10 includes a reaction chamber 12, a heater 14, a gas inlet pipe 22 and a gas outlet pipe 24. The gas inlet pipe 22 and the gas outlet pipe 24 are connected to two opposite ends of the reaction chamber 12, respectively. The heater 14 is used for controlling temperature in the reaction chamber 12 and is illustrated here as a heating coil, but is not limited thereto. The heater 14 can be other suitable heating elements such as a plasma heating device (not shown). Herein, a substrate 16 is installed at a place in the reaction chamber 12 closer to the gas outlet pipe 24. The substrate 16 can be, for example, a display substrate, a semiconductor wafer, or a transparent glass suitable for electronic device fabrication, such that a transparent conductive film 40 thereover can be formed. A reactant carrier 20 such as a container or a crucible of quartz material is disposed at a place in the reaction chamber 12 closer to the gas inlet pipe 22 to thereby carry reactant powders 20. The gas inlet pipe 22 is connected to a gas inlet 28 and the gas inlet is connected to gas sources (not shown) to thereby provide oxygen-containing gases 50 to flow through the gas inlet pipe 22 and into the reaction chamber 12. A flow meter 26 is disposed between the gas inlet 28 and the gas inlet pipe 22 to thereby control an amount of the oxygen-containing gases flowing into the reaction chamber 12.

Figure 2:
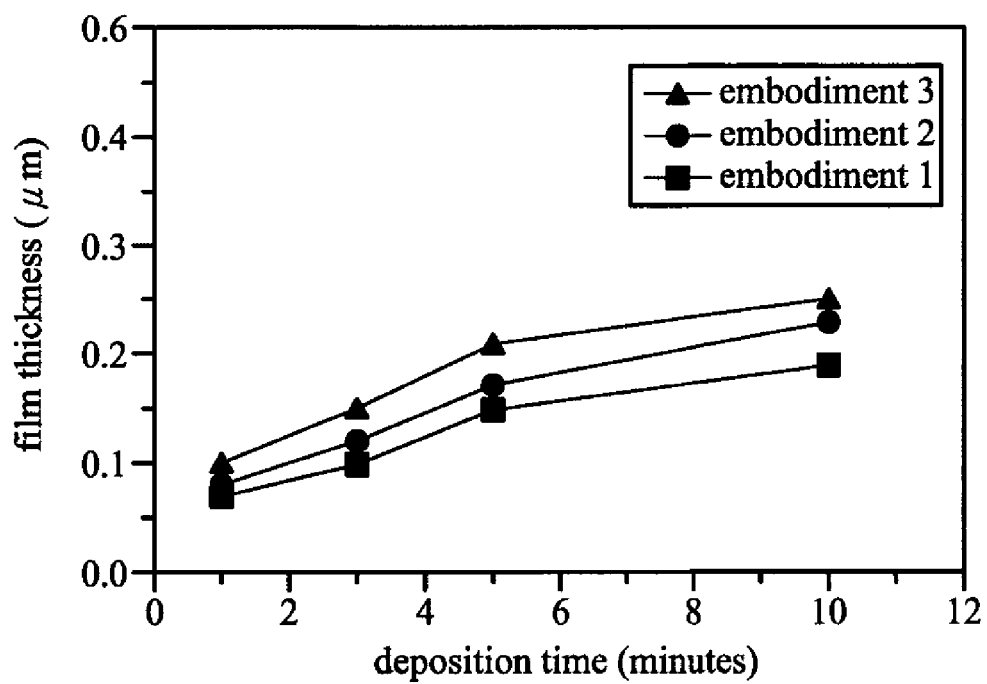
FIG. 2 is a schematic chart showing relationships between film thicknesses and film deposition temperatures according to an embodiment of the invention.

In this embodiment, the substrate 16 is first provided in the reaction chamber 12 and mixed reactant powders 20 of about 0.5 gram are provided on the reactant carrier 18 in the reaction chamber 12. The mixed reactant powders 20 may include powders of tin chloride and lithium fluoride, and a ration of the tin chloride and the lithium fluoride is about 100:30 (by weight). Next, the reaction chamber 12 is heated and maintained at a temperature of about 300° C. to thereby melt the reactant powders 20 and form vaporized reactant vapors 30. Next, oxygen-containing gases 50 are provided by the gas source (not shown) connected with the gas inlet pipe 28. The oxygen-containing gases in this embodiment can be, for example, an air having a nitrogen/oxygen ration of about 79/21. Flow rate of the oxygen-containing gases is controlled by the flow meter 26 and the oxygen-containing gases 50 were transferred by the gas inlet pipe 22 at a flow rate of about 6500 sccm into the reaction chamber 12. Herein, the oxygen-containing gases 50 are transferred into the reaction chamber 12 and then flows toward the gas outlet pipe 24, such that the vaporized reactant gases 30 are simultaneously transferred toward the substrate 16, thereby depositing a transparent conductive film 40 on the substrate 16. In this embodiment, the processes could be repeated under a fixed normal pressure, a fixed temperature of about 300 C, and varied reaction times (respectively are of about 1, 3, 5 and 10 minutes). Film thicknesses of the obtained transparent conductive film 40 formed by various reaction times were measured, thereby obtaining a schematic chart showing the relationship between film thicknesses and deposition time as shown in FIG. 2.

Embodiments 2 and 3

The film deposition system 10 was adopted to repeat the film deposition process disclosed in Embodiment 1 at a reaction temperature of 350° C. and 400° C., thereby forming transparent conductive films 40 of different film thicknesses. FIG. 2 also shows schematic charts showing relationship between film thicknesses and deposition time of the transparent conductive film in the Embodiments 2 and 3.

Comparative Embodiment 1-3

The film deposition system 10 was adopted to repeat the film deposition process disclosed in the Embodiment 1 at a reaction temperature of 300° C., 350° C. and 400° C., thereby forming transparent conductive films 40 of different film thicknesses of about 100 nm, 120 nm, and 150 nm, respectively.

According to the schematic chart illustrated in FIG. 2, a thickness of the transparent conductive film 40 was increased with increased reaction time and with elevation of a reaction temperature.

Figure 3:
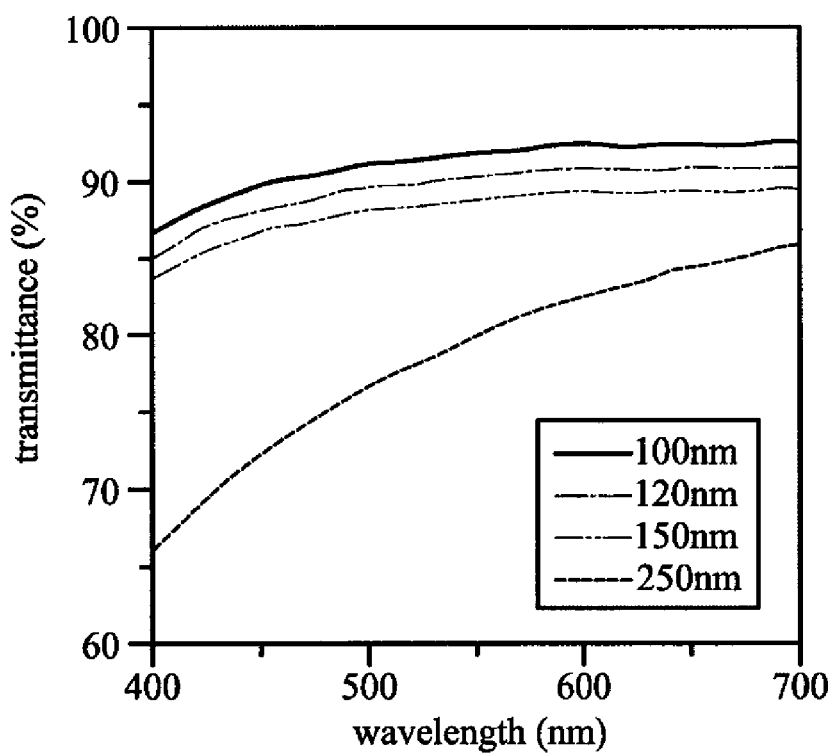
FIG. 3 is a schematic chart showing relationships between film thicknesses and light transmittance according to an embodiment of the invention.

FIG. 3 is a schematic chart showing relationships between film thicknesses and light transmittance of the transparent conductive film 40 obtained from the Embodiments 1-3 at visible light wavelengths (400~700 nm). In FIG. 3, four curves respectively showing results of the Embodiment 1 (300° C., 3 min.), the Embodiment 2 (350° C., 3 min.), the Embodiment 3 (400° C., 3 min.) and the Embodiment 4 (400° C., 10 min.) are illustrated from top to bottom. As shown in FIG. 3, when film thickness of the transparent conductive film is less than 150 nm, a visible light transmittance of 85% or more was obtained and the visible light transmittance was reduced to about 70% when film thickness was up to about 250 nm.

Figure 4:
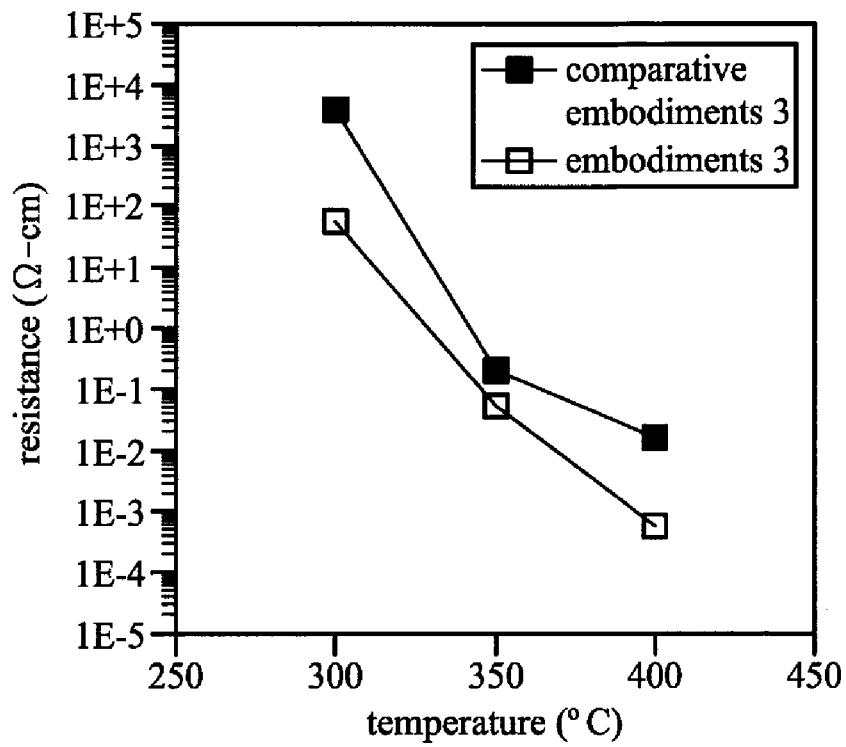
FIG. 4 is a schematic chart showing relationships between film thicknesses and resistance according to an embodiment of the invention.

Referring now to FIG. 4, curves, showing resistances of the transparent conductive films obtained in the Embodiments 3 and the Comparative Embodiment 3 with reaction times of about 3 minutes, are illustrated. As shown in FIG. 4, the transparent conductive film obtained from the reactant powders 20 mixed with lithium fluoride shows a more reduced resistance than that mixed without the lithium fluoride. Additionally, with increase of the film deposition temperature, the tin oxide in the transparent conductive film had more complete crystalline, thus reducing the resistance thereof with increased film deposition temperature. When the temperature was 400° C., the transparent conductive film obtained from the embodiment of the invention showed a resistance lower than $10^{-3}$ Ω·cm, which is equal to a sheet resistance of about 10 Ω/□ and is applicable in electronic device fabrication.

In addition, XPS and EDS analyses were performed to test the transparent conductive film obtained for a 3 minute reaction time (thickness thereof was about 150 nm) in the Embodiment 3, wherein a chlorine concentration of about 0.74 atom % or 0.88 weight percent were observed.

Figure 5:
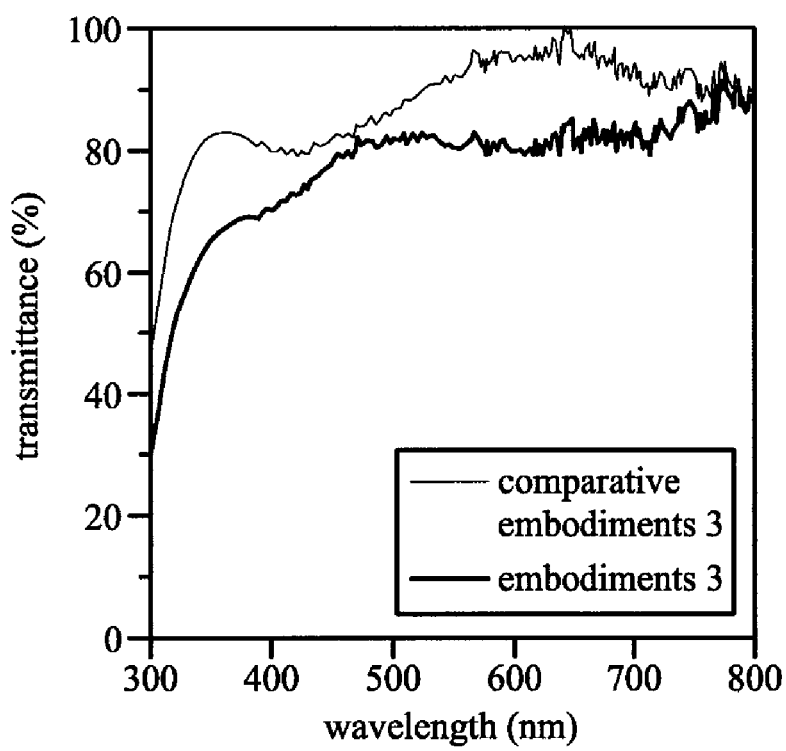
FIG. 5 is a schematic chart showing the light transmittance of a transparent conductive film according to a comparative embodiment and an embodiment of the invention.

In FIG. 5, a schematic chart shows the light transmittance of a transparent conductive film with reaction times of about 3 minutes in the Embodiment 3 and the Comparative Embodiment 3. As shown in FIG. 5, the transparent conductive film obtained from the reactant powders 20 mixed with lithium fluoride showed a 10 times resistance decrease over that mixed without the lithium fluoride, and showed a relatively lower visible light transmittance of about 80% in visible light wavelength. Thus, through the additive of lithium fluoride, the conductivity of the transparent conductive film was tremendously increased without too much reduction in the visible light transmittance thereof, thereby meeting applications for various product productions.

Typically, a transparent conductive film for electronic device applications may be heated or treated by plasma after formation thereof and thus, conductivity thereof may be changed. Thus, thermal stability is one of the important characteristics of transparent conductive films.

Figure 6:
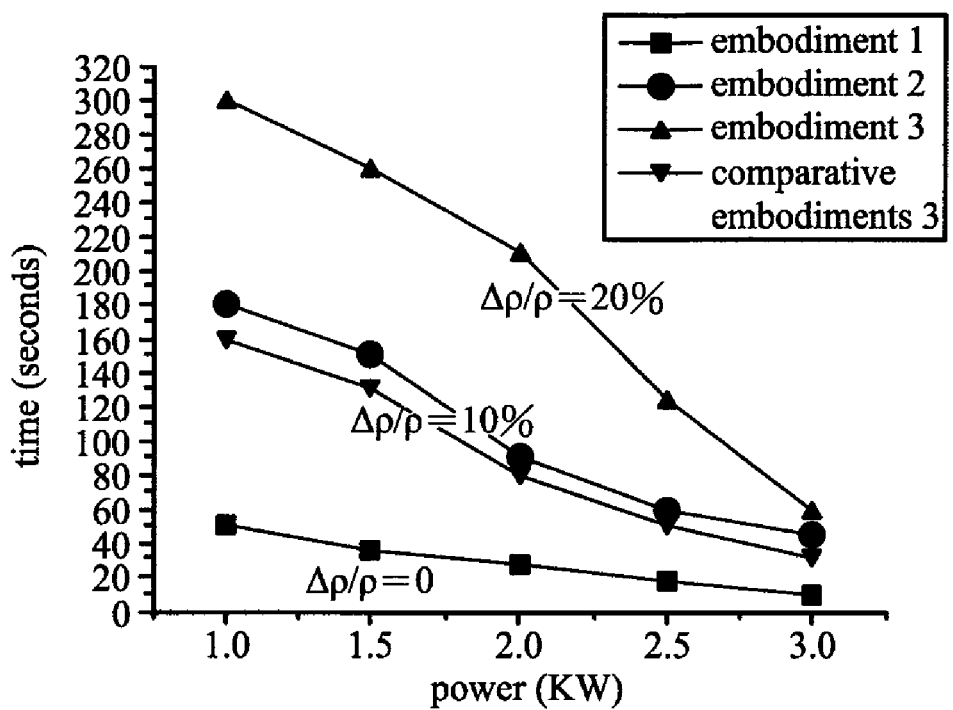
FIG. 6 is a schematic chart showing resistance variations of transparent conductive films treated by atmospheric microwave plasma according to an exemplary embodiment and a comparative embodiment of the invention.

In FIG. 6, a schematic chart shows conductivity variations of the transparent conductive films obtained from the Embodiment 3 and the Comparative Embodiment 3 with or without atmospheric plasma treating. As shown in FIG. 6, with increase of the atmospheric plasma treating time, the transparent conductive films obtained from the reactant powders 20 mixed with lithium fluoride showed a longer time for bearing the plasma bombarding without changing its resistance when compared to transparent conductive films obtained from the reactant powders 20 mixed without lithium fluoride. The results shown in FIG. 6 were judged according to same variation of the resistance, and the transparent conductive films obtained from the reactant powders 20 mixed with lithium fluoride showed a better stability than the transparent conductive films obtained from the reactant powders 20 mixed without lithium fluoride. The results shown in FIG. 6 also showed the advantages for adding lithium fluoride in the transparent conductive films of the invention.

Figure 7:
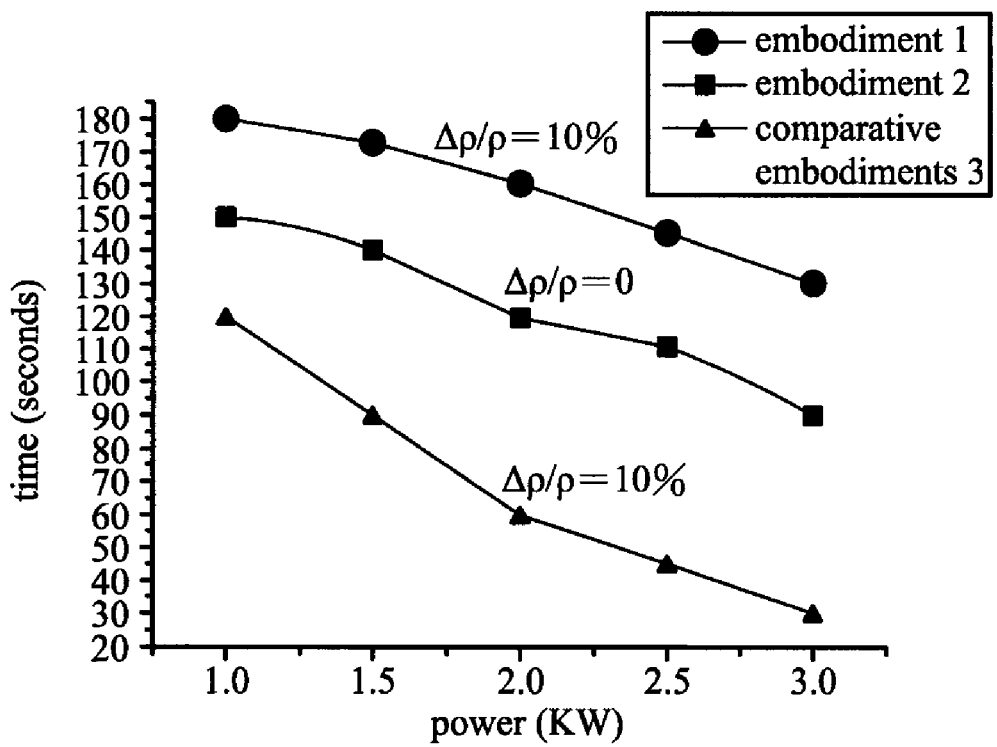
FIG. 7 is a chart showing resistance variations of a transparent conductive film treated by $20H_2/80N_2$ microwave plasma according to a comparative embodiment and an exemplary embodiment of the invention.

In FIG. 7, a schematic chart shows conductivity variations of the transparent conductive films obtained from the Embodiment 1, the Embodiment 2 and the Comparative Embodiment 3 with reaction times of about 3 minutes and reductive plasma treating (using hydrogen and oxygen of a ration of 20:80). As shown in FIG. 7, since the chlorine ions in the transparent conductive films are easily reduced and lost in a reductive atmosphere, the conductivity of the transparent conductive films were affected more when in the reductive plasma than in the atmospheric plasma. However, by adding lithium fluoride in the reactant powders for forming the transparent conductive film, a relatively stable conductivity of the transparent conductive film was obtained and conductivity under a treatment power of 2 KW for 2 minutes has held steady.

Therefore, the invention provides fabrication of chlorine doped transparent conductive films by using tin chloride of a relatively lower melting point and vapor deposition in a heated air ambient. In addition, the reactant powders are added with lithium chloride, such that the obtained transparent conductive film can be co-doped with fluorine ions and lithium ions, thereby improving a conductivity of the obtained transparent conductive film and a thermal stability thereof under plasma treating. A conductivity of about 10 Ω/□ and a visible light transmittance of about 80% of the transparent conductive film can be obtained, such that applications for various electronic products may be achieved and the novel transparent conductive film of the invention can replace the conventional transparent conductive film of ITO materials.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A chlorine, fluorine and lithium co-doped transparent conductive film, comprising:
   chlorine, fluorine and lithium co-doped tin oxides, wherein the chlorine, fluorine and lithium co-doped tin oxides have a chlorine ion doping concentration not greater than 5 atom %, a fluorine ion doping concentration not greater than 5 atom %, and a lithium ion doping concentration not greater than 5 atom %, wherein the chlorine, fluorine and lithium co-doped tin oxides have a resistance of less that $5\times10^{-4}$ Ω·cm.

2. The chlorine, fluorine and lithium co-doped transparent conductive film as claimed in claim 1, wherein the chlorine, fluorine and lithium co-doped tin oxides have a visible light transmittance greater than 80% while a thickness thereof is about 100-150 nm.

3. The chlorine, fluorine and lithium co-doped transparent conductive film as claimed in claim 1, wherein the chlorine, fluorine and lithium co-doped tin oxides have a visible light transmittance greater than 70% while a thickness thereof is about 150-250 nm.

* * * * *